(12) United States Patent
Allers et al.

(10) Patent No.: US 9,032,140 B2
(45) Date of Patent: May 12, 2015

(54) SYSTEM AND METHOD FOR ADAPTIVE BIT RATE PROGRAMMING OF A MEMORY DEVICE

(71) Applicant: Infineon Technologies AG, Neubiberg (DE)

(72) Inventors: Wolf Allers, Munich (DE); Jan Otterstedt, Unterhaching (DE); Mihail Jefremow, Augsburg (DE); Edvin Paparisto, Munich (DE); Leonardo Castro, Munich (DE)

(73) Assignee: Infineon Technologies AG, Neubiberg (DE)

( * ) Notice: Subject to any disclaimer, the term of this patent is extended or adjusted under 35 U.S.C. 154(b) by 189 days.

(21) Appl. No.: 13/751,883

(22) Filed: Jan. 28, 2013

(65) Prior Publication Data

US 2014/0215124 A1    Jul. 31, 2014

(51) Int. Cl.

| G11C 16/10 | (2006.01) |
|---|---|
| G06F 12/02 | (2006.01) |
| G11C 16/06 | (2006.01) |
| G11C 16/24 | (2006.01) |
| G11C 16/34 | (2006.01) |

(52) U.S. Cl.
CPC ............ *G06F 12/0246* (2013.01); *G11C 16/06* (2013.01); *G11C 16/10* (2013.01); *G11C 16/24* (2013.01); *G11C 16/3486* (2013.01)

(58) Field of Classification Search
CPC ............... G11C 16/30; G11C 16/0483; G11C 16/24; G11C 16/10; G11C 12/0246; G11C 13/0069; G11C 7/00; G11C 2013/0076; G11C 2013/0092; G11C 16/00; G11C 16/3454; G11C 2013/0078; G11C 2013/0088; G11C 2211/5621; G11C 2213/77; G11C 2013/009; G11C 11/406; G11C 13/0026
USPC ...................................... 711/103; 365/185.17
See application file for complete search history.

(56) References Cited

U.S. PATENT DOCUMENTS

| 2003/0002331 A1* | 1/2003 | Park et al. ..................... 365/163 |
| 2004/0145947 A1* | 7/2004 | Micheloni et al. ........ 365/185.19 |
| 2007/0242549 A1* | 10/2007 | Klostermann et al. ........ 365/226 |
| 2008/0025121 A1* | 1/2008 | Tanzawa ......................... 365/212 |
| 2008/0094127 A1* | 4/2008 | Betser et al. .................. 327/536 |
| 2008/0259683 A1* | 10/2008 | Lisi et al. ................... 365/185.2 |
| 2010/0246284 A1* | 9/2010 | Widjaja et al. ........... 365/189.09 |
| 2012/0033491 A1* | 2/2012 | Shelton et al. ............. 365/185.2 |

* cited by examiner

*Primary Examiner* — Hashem Farrokh
(74) *Attorney, Agent, or Firm* — Eschweiler & Associates, LLC

(57) ABSTRACT

The disclosure relates to an electronic memory system, and more specifically, to a system for adaptive bit rate programming of a memory device, and a method for adaptive bit rate programming of a memory device. According to an embodiment, a system for adaptive bit rate programming of a memory device including a plurality of memory cells is provided, wherein the memory cells are configured to be electrically programmable by application of a current supplied by a current source, the system including selection devices for selecting memory cells for programming based on availability of current from the current source.

17 Claims, 8 Drawing Sheets

SYSTEM AND METHOD FOR ADAPTIVE BIT RATE PROGRAMMING OF A MEMORY DEVICE

FIELD

The disclosure generally relates to an electronic memory system, and more specifically, to a system for adaptive bit rate programming of a memory device, and a method for adaptive bit rate programming of a memory device.

BACKGROUND

An electronic memory system generally comprises a plurality of memory cells for storing information. Each of these memory cells is adapted to store a specific amount of data. In many conventional systems each memory cell can store one bit of information, i.e. the memory cell can adopt two states.

In many conventional non-volatile memory systems, such as EPROM, EEPROM, or Flash memory systems, a memory cell comprises a floating gate transistor comprising a floating gate which is completely surrounded by highly resistive material and is therefore electrically isolated from the remaining gates and inputs of the floating gate transistor. Therefore, if the floating gate is charged with a certain amount of electrical charge, this amount remains unchanged over long periods of time. Consequently, a floating gate transistor can adopt two states which can be maintained over extended periods of time without a connection to a power supply: a first state in which the charge carried by the floating gate is above a given threshold and a second state in which the charge carried by the floating gate is below this threshold. Therefore, a floating gate transistor can be used to store a single bit of information. With the introduction of additional thresholds, more than one bit of information can be stored in a memory cell.

Unlike true read-only memory systems, the non-volatile memory systems mentioned above are not designed to store data permanently. Instead, theses systems are designed to be programmable by a user of the respective memory system. Once programmed, the memory system will store the data until the data is erased. After the data has been erased, the memory system can be re-programmed to hold new data.

The non-volatile memory systems mentioned above employ various mechanisms for the erasing of data. An EPROM, for example, can be erased by exposing it to strong ultraviolet light. In contrast, EEPROM and Flash memory systems can be erased electrically.

All these systems, however, are programmed electrically, i.e. by applying a voltage to specific areas of the memory device for a specific amount of time resulting in currents to flow in the memory device. Typically, in EPROM, EEPROM and Flash memory systems these currents are used to induce Fowler-Nordheim tunneling or they are used for hot carrier injection.

The specific amount of current required to program or write a given memory cell depends on various factors such as cell conditions, temperature, supply voltage or process variations. Additionally, in most memory systems only a limited current is available for write operations. In conventional memory systems, a constant number of memory cells is programmed in parallel, whereby this number is chosen to satisfy the worst case maximum current requirement defined by the aforementioned cell conditions. Since this worst case has a very low probability of occurrence, it follows that in most cases the available current is not used to its full extent. Thus, in conventional memory systems the resources available for the programming of memory cells are not used optimally.

For these or other reasons there is a need for an improved system and/or method for adaptive bit rate programming of a memory device.

SUMMARY

In accordance with an aspect of the disclosure, there is provided a system for adaptive bit rate programming of a memory device comprising a plurality of memory cells which are configured to be electrically programmable by application of a current supplied by a current source. The system comprises selection devices for selecting memory cells for programming based on availability of current from the current source. By making use of the selection devices the bit rate can be dynamically adjusted to the current source's ability to supply current. Compared to conventional memory devices, the write throughput can thus be increased.

In accordance with a further aspect of the disclosure, there is provided a system for adaptive bit rate programming of a memory device comprising a plurality of memory cells which are configured to be electrically programmable. The system comprises deselection devices for deselecting a memory cell from being programmed based on an electric state of the memory cell. By making use of the deselection devices a sufficiently written memory cell can be deselected from being programmed. After deselection, the memory cell will no longer draw any write current. This leads to a lower current consumption during programming of the memory device. Furthermore, the current saved by deselecting sufficiently written memory cells may be used to program additional memory cells.

Further features, aspects and advantages of the present disclosure will become apparent from the following detailed description of the disclosure made with reference to the accompanying drawings.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated, as they become better understood by reference to the following detailed description.

DETAILED DESCRIPTION

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

Figure 1:
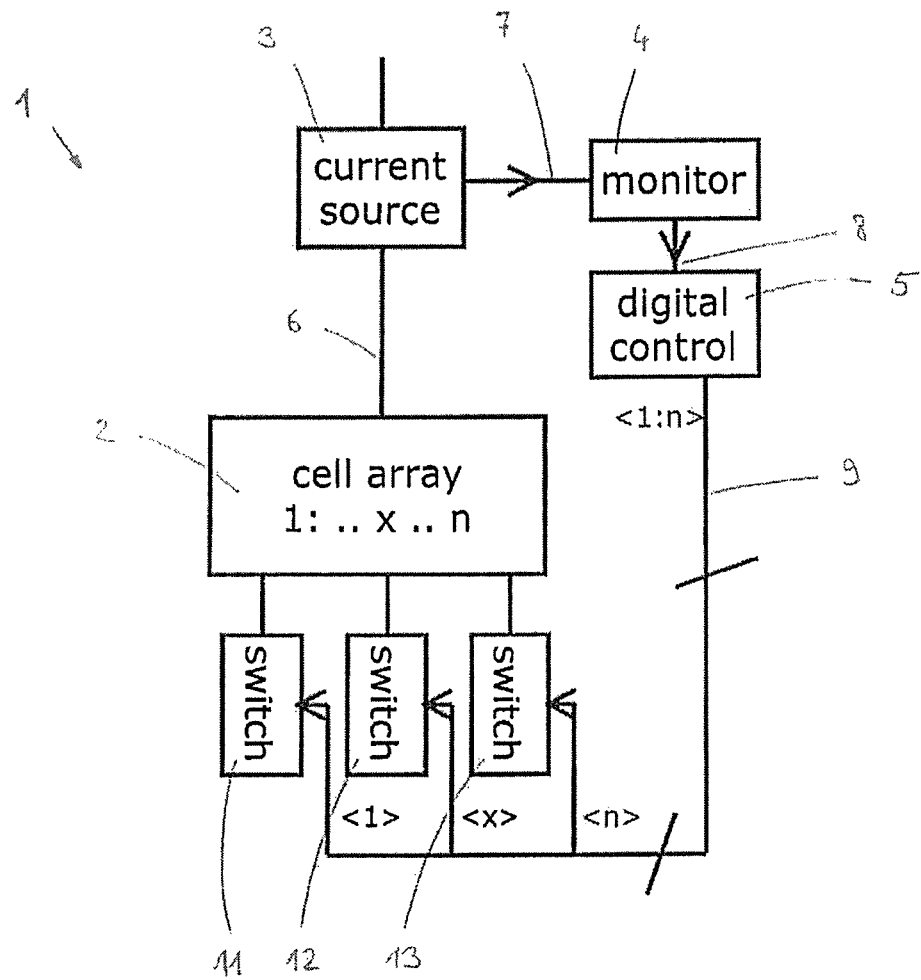
FIG. 1 depicts a schematic representation of a memory device according to an embodiment of the disclosure which comprises selection devices for selecting memory cells for programming based on availability of current from a current source and a monitor for monitoring the activity of the current source.

FIG. 1 shows a memory device 1 according to an embodiment of the disclosure. The memory device 1 comprises n memory cells arranged in a cell array 2. In one embodiment of the disclosure the memory cells are non-volatile memory cells. In another embodiment the cell array 2 comprising the n memory cells is connected to a single word line and contains all memory cells connected to this word line. Three memory cells are symbolically highlighted in FIG. 1: The first memory cell (<1>), the last memory cell (<n>), and a third memory cell (<x>) which lies between the first and the last memory cells. The memory device 1 furthermore comprises n switches. Each of the n switches is associated with one of the n memory cells and is electrically connected to the respective memory cell. FIG. 1 shows three switches 11, 12, and 13, wherein switch 11 is associated with memory cell <1>, switch 12 is associated with memory cell <x>, and switch 13 is associated with memory cell <n>.

The cell array 2 is connected to a current source 3 by a current supply line 6. In accordance with the disclosure the current source 3 can be implemented by any component that is adapted to supply current to the cell array 2. In one embodiment of the disclosure, the current source 3 is a voltage source that is configured to supply a limited current. The current source 3 is configured to supply current for programming the memory cells contained in the cell array 2. The memory device 1 furthermore comprises a monitor 4 and a digital control 5. The monitor 4 is connected to the current source 3 by a monitor input line 7 and to the digital control 5 by a monitor output line 8. Furthermore, the digital control 5 is connected to the n switches by control output lines 9. FIG. 1 symbolically shows control output lines 9 connecting the digital control 5 to each of the switches 11, 12, and 13, respectively.

As with conventional memory devices, a current supplied by the current source 3 to the cell array 2 via the current supply line 6 can be used to program the memory cells contained in the cell array 2. The process of programming a memory cell is often also referred to as "writing". Both terms refer to the process of changing the state of a memory cell from "erased" to "written" and will be used synonymously hereinafter.

The switches 11, 12, and 13 are configured to allow selection of a memory cell of the cell array 2 for programming. In one embodiment, the switches are also configured to allow deselection of a memory cell from being programmed. In particular, switch 11 is configured to select/deselect memory cell <1>, switch 12 is configured to select/deselect memory cell <x>, and switch 13 is configured to select/deselect memory cell <n>. A memory cell in the cell array 2 can be programmed by a current supplied by the current source 3 if and only if it is selected by the switch associated with the memory cell in one embodiment.

The switches 11, 12, and 13 are controlled by the digital control 5, i.e. the digital control 5 controls each of the switches associated with the memory cells contained in the cell array 2. The digital control 5 controls the switches 11, 12, and 13 based on input received from the monitor 4 which monitors the activity of the current source 3. Since the digital control 5 receives from the monitor 4 information about the activity of the current source 3, the digital control 5 can control the switches 11, 12, and 13 based on the activity of the current source 3.

In one embodiment of the disclosure the current source 3 comprises a charge pump. The monitor 4 then in one embodiment monitors the pump activity of the charge pump and provides the digital control 5 with a pump activity signal. Based on this pump activity signal received from the monitor 4 the digital control 5 can adjust the number of memory cells in the cell array 2 being programmed. If, for instance, at a particular moment a certain subset of memory cells of the cell array 2 is being programmed, a corresponding current will be drawn from the current source 3. If this current is less than the maximum current the current source 3 could supply, i.e. if the current source 3 could, at this particular moment, supply more current, the pump activity signal provided by the monitor 4 to the digital control 5 will indicate inactivity. In this case, an additional memory cell of the cell array 2 will be selected for writing by the digital control 5 with the switch associated with this memory cell.

Therefore, the switches allow the number of memory cells being programmed at a given time to be adapted to the activity of the current source 3. In particular, by making use of the monitor 4 and the digital control 5 the number of memory cells being programmed at a given time can be adapted to the amount of current available from the current source 3, resulting in a system for adaptive bit rate programming of a memory device.

Figure 2:
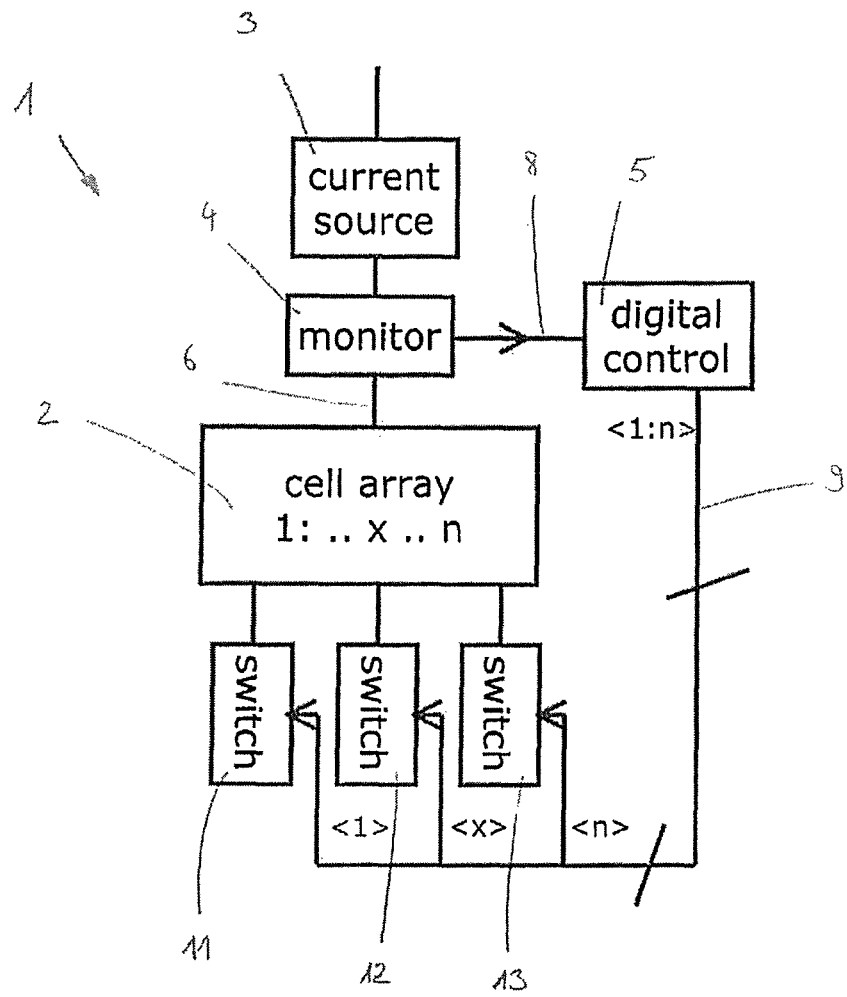
FIG. 2 depicts a schematic representation of a memory device according to an embodiment of the disclosure which comprises selection devices for selecting memory cells for programming based on availability of current from a current source and a monitor configured to measure a current flowing from the current source to a cell array.

FIG. 2 shows a memory device 1 according to a further embodiment of the disclosure. This embodiment differs from the embodiment shown in FIG. 1 by the way the monitor 4 is designed and positioned. Instead of monitoring the pump activity of the current source 3, in this embodiment the monitor 4 is used to directly measure the write current currently drawn from the current source 3 by all selected memory cells in the cell array 2. Therefore, the monitor 4 is placed in the current supply line 6 connecting the cell array 2 to the current source 3. Thus, a current drawn by the cell array 2 from the current source 3 can be easily measured by the monitor 4. The value of the current measured by the monitor 4 is supplied to the digital control 5 via the monitor output line 8. The digital control 5 then compares the received value to a predefined threshold. If the received value lies below the predefined threshold, the digital control 5 will select an additional memory cell for writing with the switch associated with this memory cell. As a consequence, in a situation where more current would be available from the current source 3 than currently drawn by all selected memory cells in the cell array 2, an additional memory cell will be selected for writing.

Thus, in the memory devices 1 shown in FIGS. 1 and 2 the write through-put can be maximized within the limits given by the available current by allowing a variable number of memory cells to be written in parallel.

Figure 3:
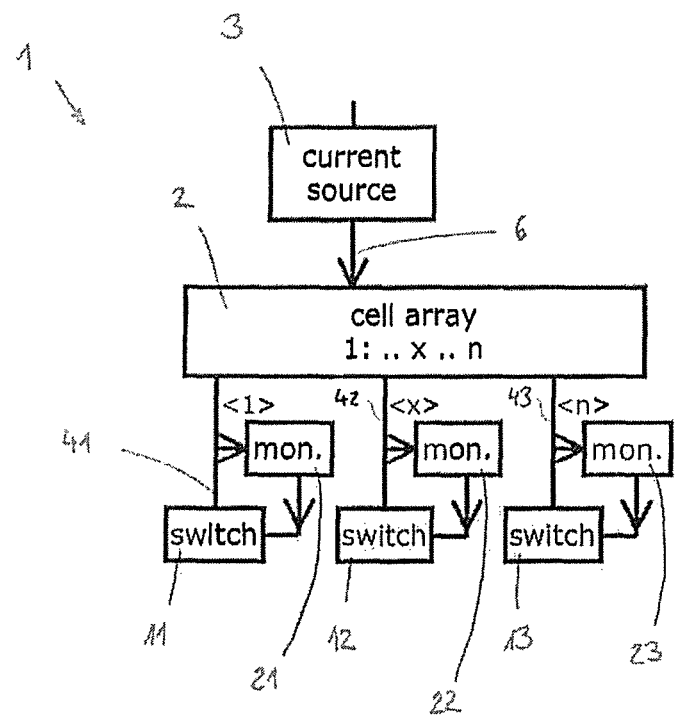
FIG. 3 depicts a schematic representation of a memory device according to an embodiment of the disclosure which comprises deselection devices for deselecting a memory cell from being programmed, wherein the deselection devices are configured for low-side sensing.

FIG. 3 shows a memory device 1 in accordance with a further embodiment of the disclosure. This memory device 1 again comprises n memory cells arranged in a cell array 2. A current source 3 is connected to the cell array 2 by a current supply line 6. The memory device 1 furthermore comprises n switches. Each of these switches is associated with one of the memory cells and connected to the associated cell by a cell output line. Three of these switches, i.e. switches 11, 12, and 13, are shown in the example of FIG. 3 together with the associated cell output lines 41, 42, and 43. The memory device 1 furthermore comprises n monitors 21, 22 and 23. Each of these monitors is associated with one of the switches and with one of the memory cells. Monitor 21 is associated with switch 11 and memory cell <1>, monitor 22 is associated with switch 12 and memory cell <x>, and monitor 23 is associated with switch 13 and memory cell <n>. Each monitor is furthermore configured to control the associated switch. Therefore, each monitor is electrically connected to its associated switch.

When a memory cell of the cell array 2 is being programmed, a current, also referred to as a write current, flows from the current source 3 through the current supply line 6 to this memory cell and from the memory cell through the associated cell output line to the associated switch. The current flowing from the memory cell through the cell output line to the switch is monitored by the monitor associated with this memory cell and switch. If, for example, memory cell <1> is being programmed, a write current flows from the current source 3 through the current supply line 6 to memory cell <1> and from memory cell <1> through cell output line 41 to the switch 11. This write current is monitored by the monitor 21. The monitors are configured to control the switches based on the write currents monitored by the monitors. Consequently, monitor 21 is configured to control switch 11 based on the write current flowing through the cell output line 41. By monitoring the write current for each of the memory cells being programmed, it is possible to receive information about the status of the memory cells during the process of programming. In particular, since the write current typically decreases when a memory cell is written sufficiently, monitoring the write current allows to detect sufficiently written memory cells.

The monitors are configured to deselect a memory cell from being programmed once they detect that a cell has been written sufficiently. In one embodiment, this is achieved by configuring each monitor to instruct the associated switch to deselect the associated memory cell from programming as soon as the monitor detects that the write current monitored by this monitor has fallen below a predetermined threshold. In another embodiment of the disclosure, the monitors are configured to determine the rate of change of the write currents and to initiate deselection of a memory cell if the absolute value of the rate of change exceeds a predetermined threshold value. In this way a very precise write completion indicator can be implemented. In both embodiments memory cells that have been written sufficiently will be deselected and will therefore no longer draw current from the current source. This reduces the current consumption during programming of the memory cells in cell array 2.

If, for instance, memory cell <1> is being programmed, as described above a write current will flow from the current source 3 through memory cell <1> and cell output line 41. Once memory cell <1> is written sufficiently, this write current will decrease. In a conventional memory device this decreased write current would continue to be drawn from the current source 3. In the memory device in accordance with the disclosure, however, as soon as memory cell <1> has been sufficiently written, monitor 21 will detect that the write current has fallen below a predetermined threshold and will therefore instruct the switch 11 to deselect memory cell <1> from programming. As a consequence, memory cell <1> will no longer draw current from the current source 3. Therefore, compared to a conventional memory device, the current consumption during programming is reduced in the memory device 1 of FIG. 3.

In the memory device 1 of FIG. 3 the concept of low-side sensing is realized, i.e. the monitors are positioned below the cell array 2 to monitor the write currents leaving the cell array 2. In contrast, in the embodiment of the disclosure shown in FIG. 4, the concept of high-side sensing is realized. Here, the monitors 21, 22 and 23 are positioned above the cell array 2 to monitor the write currents entering the cell array 2. To allow monitoring of the write currents entering the cell array 2, the current supply line 6 exiting the current source 3 is split into n cell input lines, thus connecting each of the n memory cells in the cell array 2 separately to the current source 3. For each cell input line a monitor is provided for monitoring of this cell input line.

Figure 4:
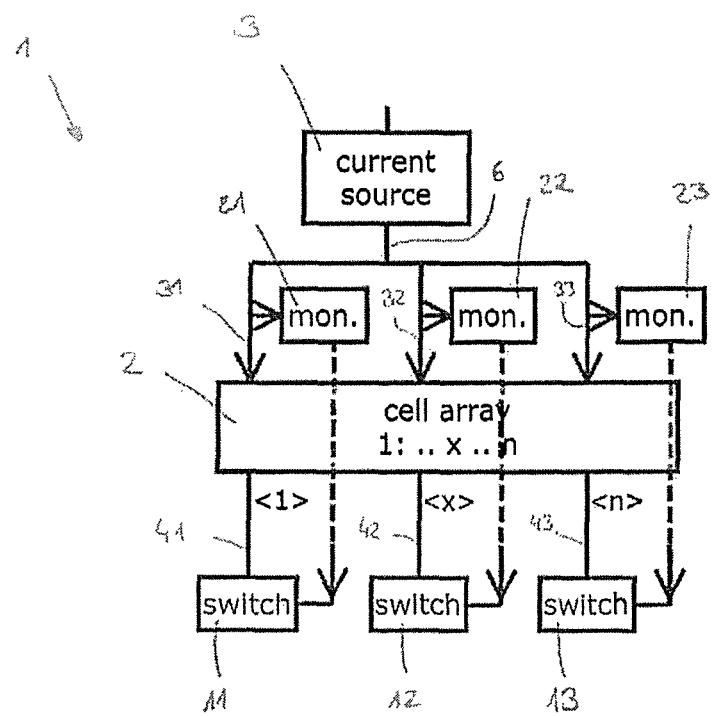
FIG. 4 depicts a schematic representation of a memory device according to an embodiment of the disclosure which comprises deselection devices for deselecting a memory cell from being programmed, wherein the deselection devices are configured for high-side sensing.

In FIG. 4 three cell input lines 31, 32, and 33 with associated monitors 21, 22, and 23 are shown as one example. Cell input line 31 connects the current source 3 to memory cell <1>, cell input line 32 connects the current source 3 to memory cell <x>, and cell input line 33 connects the current source 3 to memory cell <n>. Cell input line 31 is monitored by monitor 21, cell input line 32 is monitored by monitor 22, and cell input line 33 is monitored by monitor 23. Just as described for the memory device shown in FIG. 3, each monitor is associated with a switch and is configured to control this switch. This switch in turn is configured to select or deselect a memory cell for programming. As a result, with the memory device 1 shown in FIG. 4 the current consumption during programming of the memory cells in cell array 2 can be reduced as described above for the memory device shown in FIG. 3.

In the memory devices 1 shown in FIGS. 3 and 4 the monitoring of write currents, the detection of sufficiently written memory cells, and the deselecting of sufficiently written memory cells is performed locally, i.e. individually for each single memory cell contained in the cell array 2. In one embodiment of the disclosure the monitors employed for monitoring the write currents are dedicated sensors configured for direct measurement of the write currents. In another embodiment of the disclosure the write currents are monitored with the sense amplifiers available in conventional memory systems for reading of the memory cells. Thus, no additional components are required for monitoring the cell write currents.

Figure 5:
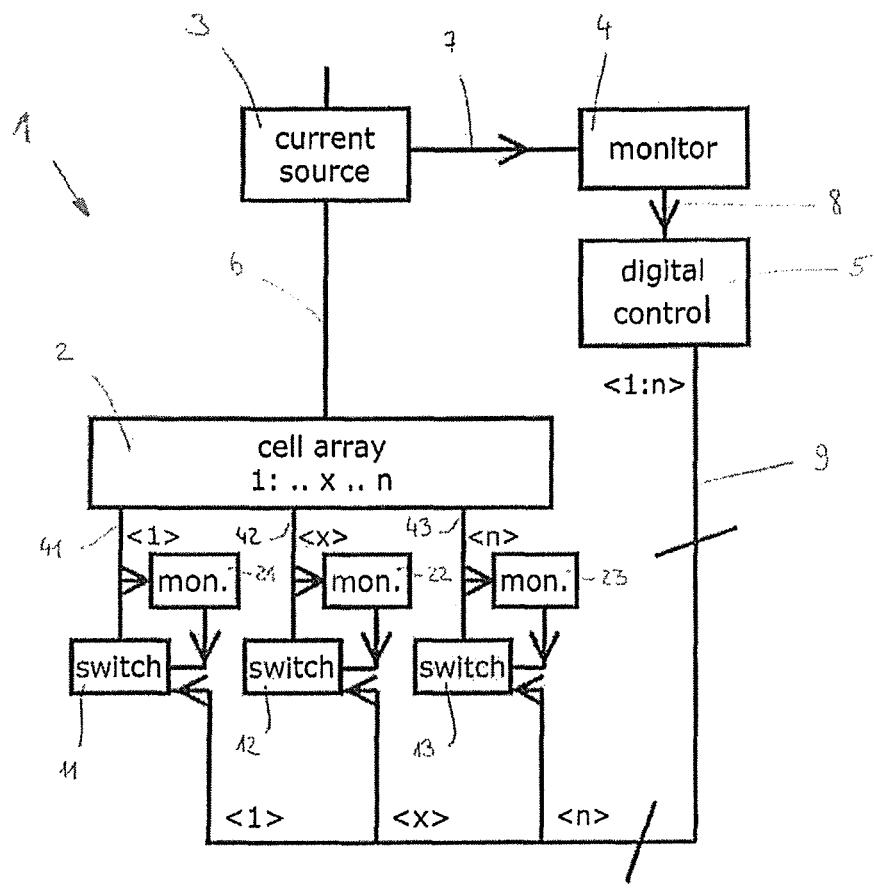
FIG. 5 depicts a schematic representation of a memory device according to an embodiment of the disclosure which comprises selection devices for selecting memory cells for programming based on availability of current from a current source and deselection devices for deselecting a memory cell from being programmed once it has been sufficiently written.

FIG. 5 shows a memory device 1 according to a further embodiment of the disclosure. This memory device 1 is configured to allow selection of additional memory cells for programming based on the availability of current from the current source 3 and to allow deselection of sufficiently written memory cells from programming. This memory device 1 combines the concepts described in the context of FIGS. 1 and 3. The memory device 1 comprises a source monitor 4 configured to monitor the activity of the current source 3. The output of the source monitor 4 is fed into the digital control 5 which is configured to control the switches associated with the memory cells of the cell array 2. In FIG. 5 three switches 11, 12, and 13 are shown in one example. The source monitor 4, the digital control 5 and the switches 11, 12, and 13 work as described in detail for the memory device depicted in FIG. 1. As a consequence, these components of the memory device 1 allow selection of additional memory cells for programming if, in a specific situation, more current is available from the current source 3 than is currently used. In this way, the write throughput of the memory device 1 can be increased without exceeding the write current available from the current source 3.

The memory device 1 of FIG. 5 furthermore comprises cell monitors. For each of the n cells contained in the cell array 2 there is a specific cell monitor associated with this cell. In FIG. 5 three of these cell monitors 21, 22, 23 are shown in one example. Each cell monitor is configured to monitor the write current of its associated memory cell and to control the switch associated with this memory cell. Cell monitor 21, for example, is configured to monitor the write current of memory cell <1> and to control switch 11. These cell monitors work as described in detail for the monitors of the memory device shown in FIG. 3. Consequently, each cell monitor is configured to deselect its associated memory cell from programming as soon as it detects that this memory cell has been written sufficiently. Thus, by making use of the cell monitors 21, 22, 23 the current consumption during programming of the memory cells of cell array 2 can be reduced. In combination with the source monitor 4 and the digital control 5 the cell monitors 21, 22, 23 allow to further increase the write throughput of memory device 1. This is achieved by deselecting sufficiently written memory cells from programming. After a memory cell has been deselected, it will, in contrast to sufficiently written memory cells in conventional memory systems, no longer draw current from the current source. The current that is saved by this process can be used to program another memory cell. The source monitor will detect that the current source could supply more current than is currently used and will initiate selection of an additional memory cell for programming.

In another embodiment of the disclosure the source monitor 4 is configured to directly measure the current flowing from the current source 3 to the cell array 2 as described for the memory device 1 shown in FIG. 2. In another embodiment of the disclosure the cell monitors are configured to perform high-side sensing as described for the memory device 1 shown in FIG. 4.

Figure 6:
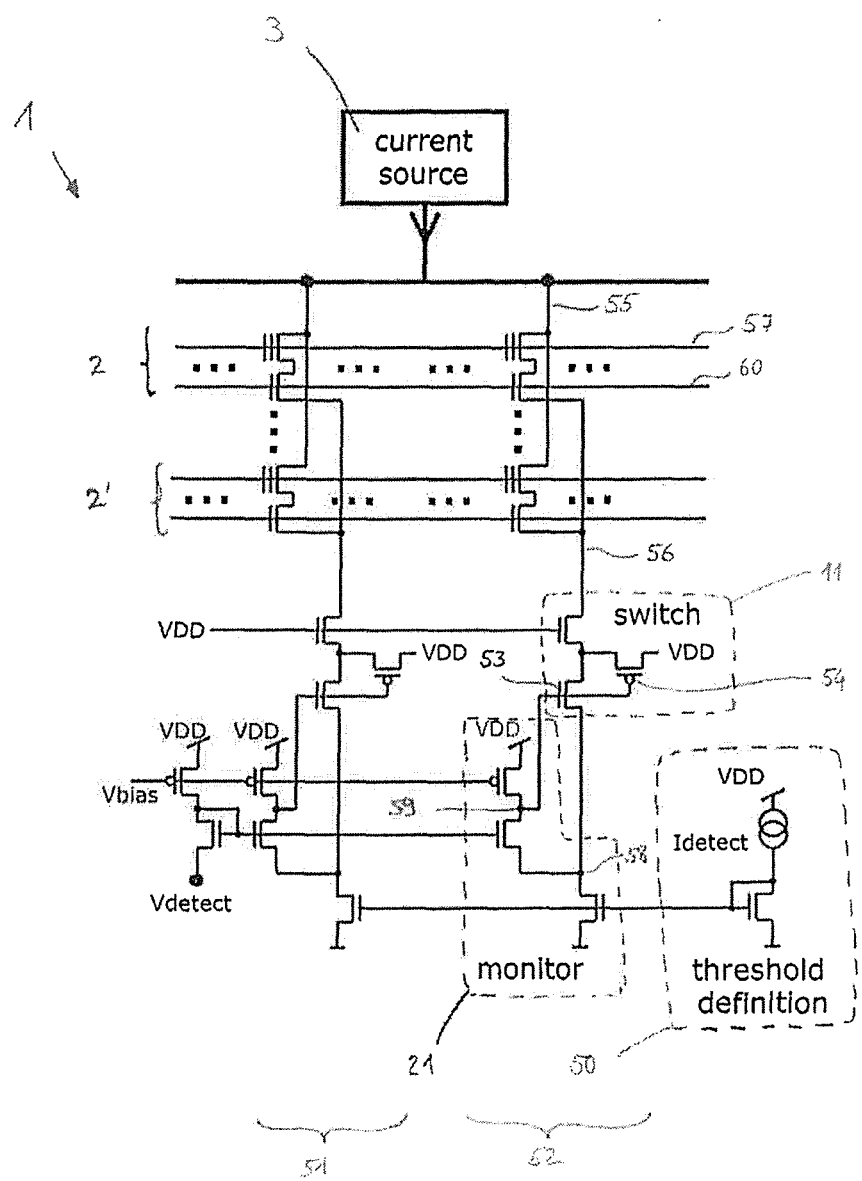
FIG. 6 depicts a detailed representation of a memory device according to an embodiment of the disclosure which comprises deselection devices for deselecting a memory cell from being programmed, wherein the deselection devices comprise a switch and a monitor for comparing a current used for programming of a memory cell to a threshold current.

FIG. 6 shows a memory device 1 according to a further embodiment of the disclosure. This memory device 1 is similar to that of FIG. 3 in that it also comprises monitors and switches for deselecting sufficiently written memory cells from programming. The monitors are configured for low-side sensing. In the embodiment of FIG. 6, however, the components of the memory device 1 are shown in more detail. The memory device 1 is a non-volatile memory device and comprises several cell arrays. Two of these cell arrays, i.e. a first cell array 2 and a second cell array 2', are shown as one example in FIG. 6. Each of the cell arrays comprises several memory cells. In FIG. 6, two memory cells, each comprising a floating gate transistor and an access transistor, are shown for each of the two cell arrays 2 and 2'. The drain terminals of the floating gate transistors of the memory cells are connected to a current source 3 by bit lines 55. The source terminals of the access transistors of the memory cells are connected to source lines 56. The control gates of the floating gate transistors of the memory cells are connected to word lines 57. The gates of the access transistors of the memory cells are connected to select lines 60.

The memory cells of the memory device 1 are arranged in a regular grid with rows and columns. In each row, the memory cells are coupled to a single word line and a single select line. In each column, the memory cells are coupled to a single bit line and a single source line. FIG. 6 shows two rows of memory cells corresponding to the first 2 and second 2' cell array and two columns, i.e. a first column 51 and a second column 52. A switch and a monitor is associated with each column of memory cells. In the memory device 1 of FIG. 6, switch 11 and monitor 21 are associated with the second column 52 of memory cells. Switch 11 and monitor 21 are coupled to the source line 56. The memory device 1 furthermore comprises a threshold definition circuit 50. This threshold definition circuit 50 is configured to define a central threshold current for the entire memory device 1. The threshold definition circuit 50 is designed to define the threshold current using a current mirror.

The operation of switch 11, monitor 21, and threshold definition circuit 50 will now be described in more detail. When a memory cell in the second column 52 is being programmed, a high write current flows from the current source 3 through the bit line 55 to the memory cell being programmed and from this memory cell through the source line 56 to the switch 11. At node 58 the write current is compared to the threshold current defined by the current mirror of the threshold definition circuit 50. As a result, the electric potential of node 58 is high. Consequently, the electric potential of node 59 is also high. Since the gates of transfer transistor 53 and the second transistor 54 of switch 11 are coupled to node 59, the transfer transistor 53 will conduct, whereas the second transistor 54 will not conduct. The write current can therefore flow from the memory cell being programmed through the switch 11. Once the memory cell has been written sufficiently, the write current will begin to decrease. As soon as the write current falls below the threshold current defined by the threshold definition current, node 58 will be drawn to VSS and, as a result, node 59 will also be drawn to VSS. The transfer transistor 53 will no longer conduct, while the second transistor 54 will conduct. The source line 56 will now be connected to VDD by the second transistor 54. As a result, no current will flow through the memory cell. Therefore, after the memory cell has been written sufficiently, the write current will be switched off completely.

Figure 7:
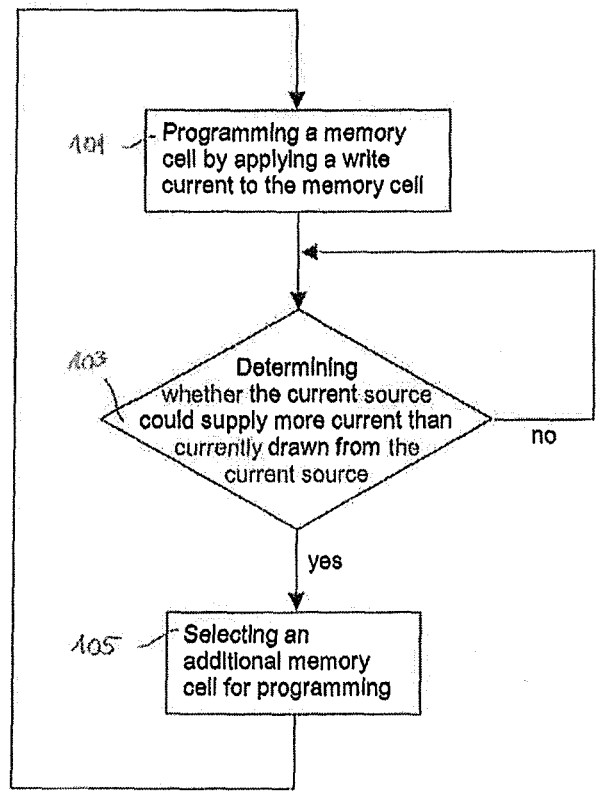
FIG. 7 depicts a schematic representation of a method for adaptive bit rate programming of a memory device according to an embodiment of the disclosure, wherein an additional memory cell is selected for programming based on the availability of additional current from a current source.

FIG. 7 depicts an example method for adaptive bit rate programming of a memory device according to an embodiment of the disclosure. The memory device comprises a plurality of memory cells configured to be electrically programmable by application of a current supplied by a current source. The method comprises programming a memory cell by applying a write current to the memory cell at 101, and determining whether the current source could supply more current than currently drawn from the current source at 103. If the current source cannot supply more current, act 103 will be repeated; if the current source could supply more current, selecting an additional memory cell for programming will be performed at 105. This memory cell will then be programmed at 101.

As a consequence, in the method represented by FIG. 7, during programming of memory cells of the memory device an additional memory cell is selected for programming based on the availability of additional current from the current source. This is in contrast to conventional writing schemes where selecting and deselecting of memory cells for programming are performed timing-driven, i.e. at or after predetermined and fixed times. Thus, with the method according to the disclosure the write throughput can be increased without exceeding the available write current by continuously matching the required write current to the available current.

Figure 8:
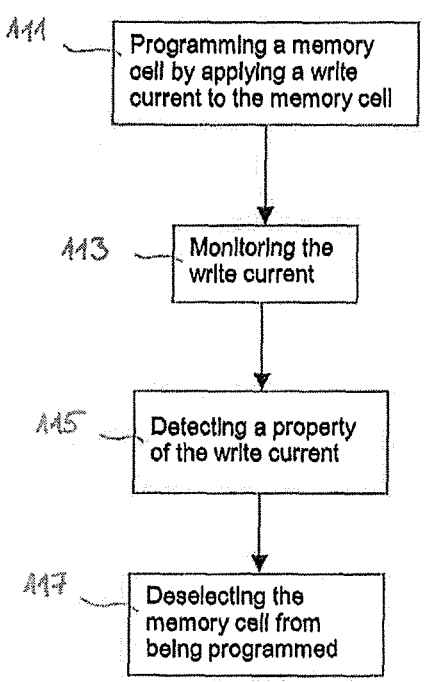
FIG. 8 depicts a schematic representation of a method for adaptive bit rate programming of a memory device according to an embodiment of the disclosure allowing deselection of sufficiently written memory cells.

FIG. 8 depicts an example method for adaptive bit rate programming of a memory device according to another embodiment of the disclosure. The memory device comprises a plurality of memory cells configured to be electrically programmable by application of a current. The method comprises programming a memory cell by applying a write current to the memory cell at 111, and monitoring the write current at 113. The method further comprises detecting a property of the write current at 115, and deselecting the memory cell from being programmed at 117. Advantageously, the property of the write current detected at 115 is indicative of the memory cell having been programmed sufficiently. In one embodiment of the disclosure the property of the write current relates to the value of the write current. In another embodiment of the disclosure the property of the write current relates to the rate of change of the write current. Thus, in the method represented by FIG. 8 a sufficiently written memory cell will be deselected from being programmed. The memory cell will then no longer draw any write current. As a result, the current required to program a memory cell can be minimized.

In another embodiment of the disclosure the two methods described in the context of FIGS. 7 and 8 are combined and are both employed in parallel during programming of a memory device. Thus, the current saved by deselecting sufficiently written memory cells can be advantageously used to program additional memory cells. As a result, the write throughput can be optimized.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A system for adaptive bit rate programming of a memory device comprising a plurality of memory cells, wherein the memory cells are configured to be electrically programmable by application of a current supplied by a current source, the system comprising:
    a selection device configured to select a memory cell for programming based on an availability of current from the current source;
    a deselection device for deselecting the memory cell from being programmed based on an electric state of the memory cell; and
    a cell monitor configured to measure a write current flowing from the memory cell to the deselection device.

2. The system of claim 1, further comprising a monitor configured to monitor the current source.

3. The system of claim 2, wherein the monitor is configured to generate a source activity signal indicative of the current source's ability to provide more current than currently drawn from the current source.

4. The system of claim 2, wherein the monitor is configured to measure the current drawn from the current source.

5. The system of claim 2, further comprising a digital control configured to receive a signal from the monitor enabling the digital control to determine whether the current source could supply more current than currently drawn from the current source, wherein the digital control is configured to initiate selection of an additional memory cell for programming via a selection device whenever the digital control determines that the current source could supply more current than currently drawn from the current source.

6. A system for adaptive bit rate programming of a memory device comprising a plurality of memory cells, wherein the memory cells are configured to be electrically programmable, the system comprising:
    a deselection device configured to deselect a memory cell from being programmed based on an electric state of the memory cell; and
    a cell monitor configured to measure a write current flowing from the memory cell to the deselection device, wherein the electric state of the memory cell is associated with the measured write current.

7. The system of claim 6, further comprising a plurality of cell monitors, each associated with a respective one of the plurality of memory cell, wherein the cell monitors are each configured to derive the electric state of their respective memory cells they are associated with from the measured a write current.

8. The system of claim 7, wherein the cell monitors are configured to initiate deselection of their respective memory cells they are associated with from programming whenever the electric state of the memory cell indicates that the memory cell has been sufficiently programmed.

9. A method for adaptive bit rate programming of a memory device, the memory device comprising a plurality of memory cells configured to be electrically programmable by application of a current supplied by a current source, comprising:
    programming a memory cell by applying a write current to the memory cell;
    determining whether the current source could supply more current than currently drawn from the current source;
    if the current source could supply more current than currently drawn from the current source, selecting an additional memory cell for programming;
    monitoring the write current;
    detecting a property of the write current comprising detecting that an absolute value of a rate of change of the write current has exceeded a predefined threshold value; and
    selectively deselecting the memory cell from being programmed based on the detected property.

10. The method of claim 9, wherein determining whether the current source could supply more current than currently drawn from the current source comprises monitoring the status of the current source.

11. The method of claim 10, wherein monitoring the status of the current source comprises generating a source activity signal indicative of the current source's ability to provide more current than currently drawn from the current source.

12. The method of claim 10, wherein monitoring the status of the current source comprises measuring the current drawn from the current source.

13. The method of claim 9, further comprising:
monitoring the write current applied to a memory cell;
detecting a property of the write current; and
selectively deselecting the memory cell from being programmed based on the detected property.

14. A method for adaptive bit rate programming of a memory device, the memory device comprising a plurality of memory cells configured to be electrically programmable by application of a current, the method comprising:
programming a memory cell by applying a write current to the memory cell;
monitoring the write current;
detecting a property of the write current comprising detecting that an absolute value of a rate of change of the write current has exceeded a predefined threshold value; and
selectively deselecting the memory cell from being programmed based on the detected property.

15. The method of claim 14, wherein the property of the write current is indicative of the memory cell having been programmed sufficiently.

16. The method of claim 14, wherein detecting a property of the write current comprises detecting that the write current has fallen below a predefined threshold value.

17. The method of claim 14, wherein deselecting the memory cell from being programmed comprises switching off the write current.

* * * * *